US008815654B2

United States Patent
Gauthier, Jr. et al.

(10) Patent No.: US 8,815,654 B2
(45) Date of Patent: Aug. 26, 2014

(54) VERTICAL CURRENT CONTROLLED SILICON ON INSULATOR (SOI) DEVICE SUCH AS A SILICON CONTROLLED RECTIFIER AND METHOD OF FORMING VERTICAL SOI CURRENT CONTROLLED DEVICES

(75) Inventors: Robert J. Gauthier, Jr., Hinesburg, VT (US); Junjun Li, Williston, VT (US); Souvick Mitra, Burlington, VT (US); Mahmoud A Mousa, South Burlington, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 1858 days.

(21) Appl. No.: 11/762,811

(22) Filed: Jun. 14, 2007
(Under 37 CFR 1.47)

(65) Prior Publication Data

US 2008/0308837 A1    Dec. 18, 2008

(51) Int. Cl.
*H01L 21/84* (2006.01)
*H01L 27/02* (2006.01)

(52) U.S. Cl.
CPC .................................. *H01L 27/0262* (2013.01)
USPC ........... 438/133; 257/107; 257/538; 257/565; 257/E21.704; 257/E29.001; 438/309; 438/381; 438/479

(58) Field of Classification Search
CPC . H01L 21/84; H01L 27/0262; H01L 27/0623; H01L 27/1203
USPC ......... 257/107–182, 356, 361–362, 279, 458, 257/461–464, 470, 490, 494–495, 509, 525, 257/544–550, 656, 927, 929; 438/107–182, 438/356, 361–362
See application file for complete search history.

(56) References Cited

U.S. PATENT DOCUMENTS

| 4,117,505 A * | 9/1978 | Nakata .......................... 257/162 |
| 4,908,328 A | 3/1990 | Hu et al. |

(Continued)

FOREIGN PATENT DOCUMENTS

| JP | 03-034347 A | 2/1991 |
| JP | 7084839 A | 3/1995 |

(Continued)

OTHER PUBLICATIONS

PCT ISR Dec. 3, 2008.

(Continued)

*Primary Examiner* — David Vu
*Assistant Examiner* — Jonathan Han
(74) *Attorney, Agent, or Firm* — Law Office of Charles W. Peterson, Jr.; Anthony Canale (57) ABSTRACT

A Silicon on Insulator (SOI) Integrated Circuit (IC) chip with devices such as a vertical Silicon Controlled Rectifier (SCR), vertical bipolar transistors, a vertical capacitor, a resistor and/or a vertical pinch resistor and method of making the device(s). The devices are formed in a seed hole through the SOI surface layer and insulator layer to the substrate. A buried diffusion, e.g., N-type, is formed through the seed hole in the substrate. A doped epitaxial layer is formed on the buried diffusion and may include multiple doped layers, e.g., a P-type layer and an N-type layer. Polysilicon, e.g., P-type, may be formed on the doped epitaxial layer. Contacts to the buried diffusion are formed in a contact liner.

39 Claims, 10 Drawing Sheets

(56) References Cited

U.S. PATENT DOCUMENTS

| | | | |
|---|---|---|---|
| 4,989,057 A | 1/1991 | Lu | |
| 5,418,391 A | 5/1995 | Huang | |
| 5,453,384 A * | 9/1995 | Chatterjee | 438/135 |
| 5,546,557 A | 8/1996 | Allen et al. | |
| 5,821,572 A * | 10/1998 | Walker et al. | 257/107 |
| 5,828,110 A | 10/1998 | Wollesen | |
| 6,015,992 A | 1/2000 | Chatterjee et al. | |
| 6,086,627 A | 7/2000 | Bass, Jr. et al. | |
| 6,258,634 B1 * | 7/2001 | Wang et al. | 438/133 |
| 6,476,450 B2 | 11/2002 | Kondo et al. | |
| 6,521,952 B1 | 2/2003 | Ker et al. | |
| 6,610,262 B1 | 8/2003 | Peng et al. | |
| 6,690,069 B1 | 2/2004 | Vashchenko et al. | |
| 6,750,515 B2 | 6/2004 | Ker et al. | |
| 6,768,619 B2 | 7/2004 | Ker et al. | |
| 6,780,725 B2 | 8/2004 | Fujimaki | |
| 7,223,640 B2 * | 5/2007 | Pelella et al. | 438/149 |
| 2002/0053705 A1 * | 5/2002 | Kondo et al. | 257/368 |
| 2002/0190265 A1 | 12/2002 | Hsu et al. | |
| 2003/0213995 A1 | 11/2003 | Duvvury et al. | |
| 2004/0075146 A1 | 4/2004 | Yu et al. | |
| 2004/0207021 A1 | 10/2004 | Russ et al. | |
| 2006/0197154 A1 | 9/2006 | Pelella et al. | |

FOREIGN PATENT DOCUMENTS

| | | |
|---|---|---|
| JP | 2002-141476 A | 5/2002 |
| JP | 2003-338558 A | 11/2003 |

OTHER PUBLICATIONS

Burghartz, et al. "BiCMOS Isolation Technology Using Epitaxial Lateral Overgrowth and Preferential Polishing," IBM TDB, Jul. 1992.

* cited by examiner

VERTICAL CURRENT CONTROLLED SILICON ON INSULATOR (SOI) DEVICE SUCH AS A SILICON CONTROLLED RECTIFIER AND METHOD OF FORMING VERTICAL SOI CURRENT CONTROLLED DEVICES

BACKGROUND OF THE INVENTION

1. Field of the Invention

The present invention generally relates to current controlled devices and more particularly to current controlled Silicon on Insulator (SOI) devices that may be suitable for use as Electrostatic discharge (ESD) protect devices for CMOS Integrated Circuits (ICs).

2. Background Description

Integrated Circuit (IC) chips made in the complementary insulated gate Field Effect Transistor (FET) technology, commonly referred to as CMOS, are very sensitive to ElectroStatic Discharge (ESD). A single ESD event can destroy circuit FETs, thereby rendering a typical CMOS IC useless. An electrical charge can accumulate on the surface of gate conductors, for example, to create a breakdown oxide electric field where large currents experienced in an ESD event damage the respective device. Consequently, ESD is a significant reliability concern in the processing and handling these delicate semiconductor devices, and especially for state of the art ultra-thin thin oxide CMOS technologies.

Normally, after manufacture is completed, IC chips are packaged inside a ceramic or plastic package that has wiring leads connecting package pins and chip Input/Output (I/O) pads. Consequently, floating gates connected to I/O pads remain particularly vulnerable to ESD. To mitigate this ESD problem, IC chips normally have ESD protection devices at chip pads. The ESD protect devices shunt destructive high current away from connected devices.

Historically, older bulk FET chips relied upon Silicon Controlled Rectifiers (SCRs) for adequate ESD protection. A typical SCR protect device acts as a high-performance, high-current clamp that can redirect ESD currents away from vulnerable devices at low turn-on or clamping voltages and under short response times. Unfortunately, a phenomenon known as latch-up is a common design problem in legacy bulk CMOS technologies. Latch-up occurs when PFETs and NFETs are placed too close together on a bulk substrate, such that a parasitic horizontal SCR forms by the placement. Noise can turn on the horizontal SCR, which clamps the FET back bias voltages together and typically destroys the chip. Eliminating latch-up (and reducing device capacitances for better performance) was one of the primary motivations for migrating CMOS to Silicon Insulator (SOI).

Substantially eliminating intrinsic SCRs by migrating to SOI has made providing suitable ESD protect devices much more difficult. Bulk CMOS SCR designs do not work well in SOI because, by the very nature of the technology, device N and P features on the SOI surface layer are fully isolated from each other. Consequently, designing a conventional SCR structure in SOI requires large tracts of valuable chip active area.

Thus, there is a need for a relatively small ESD protection device for ultra-thin oxide technologies such as for SOI CMOS chips, and in particular for such an SCR that occupies very little chip active area.

SUMMARY OF THE INVENTION

It is therefore a purpose of the invention to protect Integrated Circuits (ICs) from ElectroStatic Discharge (ESD).

It is another purpose of this invention to protect ICs from ESD while minimizing the space penalty incurred for such protection.

It is yet another purpose of the invention to minimize IC real estate occupied by ESD protection devices.

It is yet another purpose of the invention to protect SOI CMOS ICs from ESD while minimizing IC real estate occupied by ESD protection devices.

It is yet another purpose of the invention to provide passive circuit elements that occupy minimum IC real estate.

The present invention is related to a Silicon on Insulator (SOI) Integrated Circuit (IC) chip with devices such as a vertical Silicon Controlled Rectifier (SCR), vertical bipolar transistors, a vertical capacitor, a resistor and/or a vertical pinch resistor and method of making the device(s). The devices are formed in a seed hole through the SOI surface layer and insulator layer to the substrate. A buried diffusion, e.g., N-type, is formed through the seed hole in the substrate. A doped epitaxial layer is formed on the buried diffusion and may include multiple doped layers, a P-type layer on an N-type layer. Polysilicon, e.g., P-type, may be formed on the doped epitaxial layer. Contacts to the buried diffusion are formed in a contact liner.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
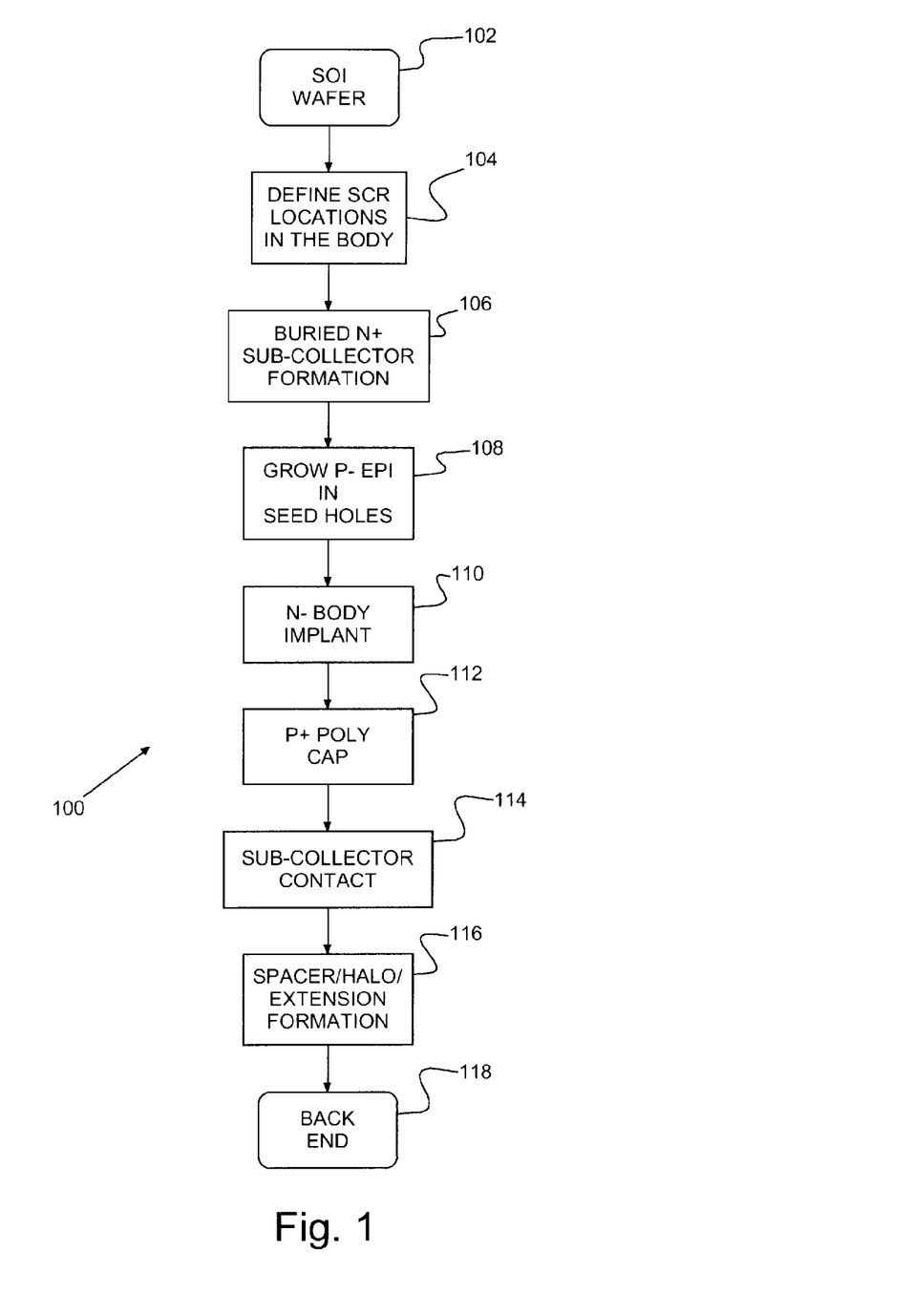
FIG. 1 shows an example of a method of forming a vertical Silicon Controlled Rectifier (SCR) in Silicon on Insulator (SOI) chips according to a preferred embodiment of the present invention

Turning now to the drawings, and more particularly, FIG. 1 shows an example of a method 100 of forming a vertical Silicon Controlled Rectifier (SCR) in Silicon on Insulator (SOI) chips according to a preferred embodiment of the present invention. Although shown here for a single SCR (i.e., a pair of back to back bipolar transistors, NPN and PNP or, series connected diodes in a PNPN structure), it is understood that when used for ElectroStatic Discharge (ESD) protection, for example, a typical chip includes an ESD protection SCR at each chip pad or, at least at each chip Input/Output (I/O) pad. Thus, each chip may include several hundred or even a thousand or more such SCRs. Further, each semiconductor product may be one of a number of such chips identically formed simultaneously on a semiconductor wafer, e.g., a SOI wafer 102.

So, in step 104, SCR locations are defined coincident with device island definition. In step 106, a buried sub-collector is formed in each SCR location, e.g., a N-type diffusion. In step 108 in situ doped silicon (P-doped in this example) is epitaxially grown on each buried sub-collector, forming a first junction. In step 110 the epitaxially grown silicon (epi) is doped (N-doped in this example) to a selected depth to form a second junction. In step 112 the third SCR junction is formed by a polysilicon cap (P-doped in this example) formed on the epi. In step 114 contacts are formed to the buried sub-collector. In step 116 chip device formation is completed, which also forms contacts at each of the remaining SCR electrodes. Finally, in step 118 using typical Back End Of the Line (BEOL) processing steps, devices are connected together into circuits and off chip to pads, protected by preferred SCRs.

FIGS. 2A-F show a cross-sectional example of forming a vertical SCR according to a preferred embodiment of the present invention with reference to the steps of the example of FIG. 1. SCR formation begins in 102 with an SOI wafer 120 in FIG. 2A that includes a bulk semiconductor (e.g., silicon) substrate 122 supporting a dielectric layer 124, e.g., Buried OXide (BOX), and a silicon surface layer 126. Preferably, the SOI wafer is a hybrid plane orientation (HOT) SOI wafer (A[1] SOI) and SCRs are formed substantially coincident with forming circuit devices, i.e., Field Effect Transistors (FETs) in the silicon surface or active layer 126. After typical standard HOT semiconductor wafer processing, the surface silicon layer 126 is patterned in step 104, e.g., using typical photolithographic masking and etching to etch islands 128 in the surface silicon layer 126. Coincidentally, SCR seed holes 130 are opened through the BOX layer 124 to the underlying silicon substrate 122.

Figure 2A:
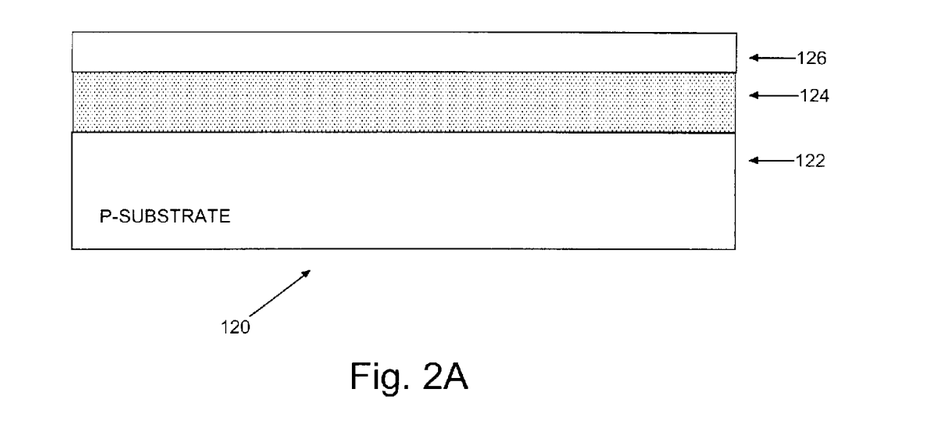
FIGS. 2A-F show a cross-sectional example of forming a preferred vertical SCR.
Figure 2B:
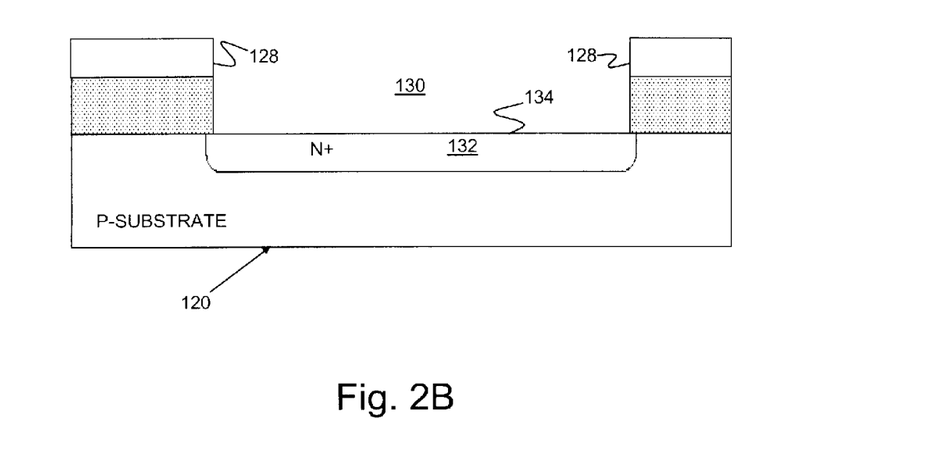

Next the islands 128 are doped with a channel tailoring dopant and, coincidentally, as shown in FIG. 2B, in step 106 buried sub-collector regions 132 are formed in the seed holes 130, e.g., with an angled implant into the exposed surface of the substrate 122. So, for a P-type substrate 122 the area exposed in the seed holes 130 are doped with N+ dopant impurity to form buried N+ diffusion 132. The dopant diffuses both vertically and horizontally to extend around perimeter of the seed hole 130 under the surface layer, i.e., the islands 128. Preferably, Phosphorus is implanted at a density of 7.5E14 with an implanted energy of seven thousand electron volts (7 keV) and the angle are selected to ensure a low resistance buried implant contact to the surface of the semiconductor substrate 122. Optionally, after the angled implant the exposed substrate surface 134 can be laser annealed for improved dopant activation.

Figure 2C:
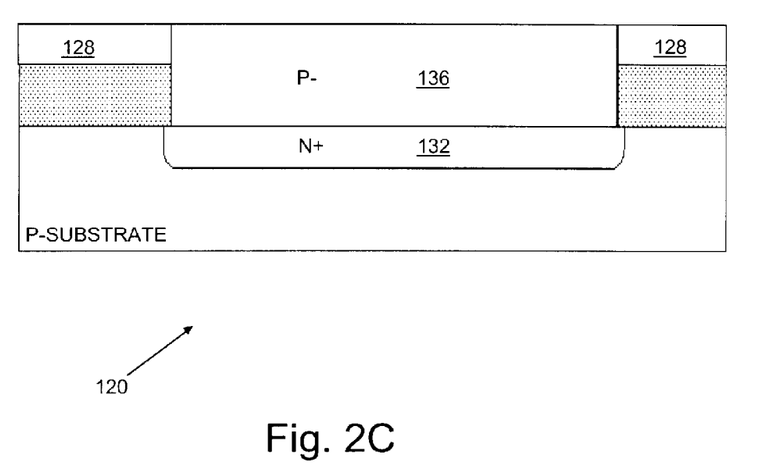
Figure 2D:
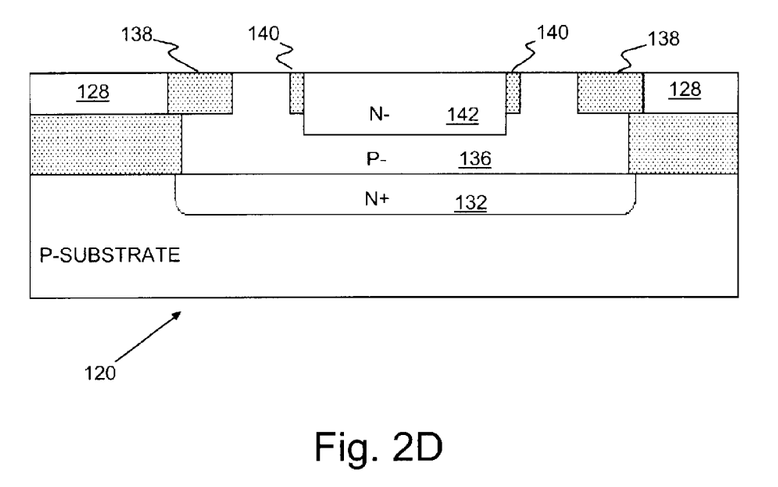

The dopant definition photoresist is removed and, as shown in FIG. 2C, P-type silicon 136 is epitaxially grown on the buried sub-collectors in step 108 to fill the seed holes. Preferably, the epi 136 is in situ doped P− or doped coincident with P-well definition, e.g., implanting $BF_2$ at a density of 10.2E13 at 70 keV. Also, any epi growth external to the seed holes on the surface layer may be either dealt with by planarization or with another suitable photo mask step. The P− epi 136 forms a first junction with each buried sub-collector 132. The wafer is planarized, e.g., using a suitable Chemical-Mechanical Polish (Chem-Mech Polish or CMP). The P− epi 136 is separated from the surface layer islands 128, e.g., using standard Shallow Trench Isolation (STI) 138, as shown in FIG. 2D. So, for example, openings 138 are formed at boundaries between the islands 128 and seed holes 130 and extend horizontally to and, preferably not beyond, the perimeters of the buried sub-collectors 132. External contacts to the P− epi electrode are also defined by inboard STI 140. Next, coincident with P-type FET (PFET) channel tailoring, the surface of the P− epi is counterdoped/implanted with N− dopant in step 110, which forms a surface N− body layer 142 and, as a result, a second junction. Preferably, surface N− body layer 142 is 70-90 nanometers (nm) thick.

Figure 2E:
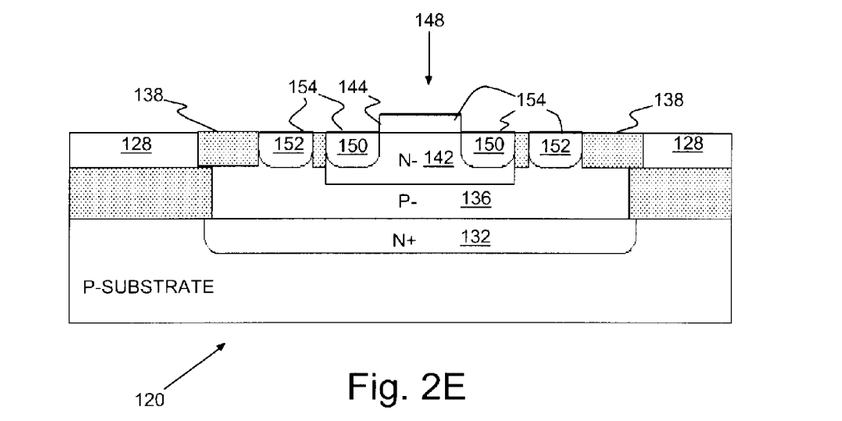

The final SCR junction is formed in step 112 as shown in FIG. 2E, coincident with device gate formation. So, device gate formation begins by selectively forming gate oxide (not shown) on the wafer surface. Preferably, after forming gate oxide, using a typical photolithographic mask, for example, the surface layer is masked with the upper epi surface remaining exposed. Then, using a suitable wet etch, for example, gate oxide is removed from the epi. A polysilicon layer is deposited on the wafer and, as a result, on exposed epi surface and patterned, e.g., photolithographically. Patterning the polysilicon layer defines FET gates and an upper (polysilicon) electrode 144 on each SCR 148, i.e., in direct contact with the epi surface. Next, FET definition continues in a typical source/drain implant. Preferably, first N-type dopant is implanted in the surface layer for N+ source/drain diffusions at N-type FETs (NFETs) and at SCR contact diffusions 150; followed by implanting P-type dopant for P+ source/drain diffusions at P-type FETs (PFETs) and at SCR contact diffusions 152, e.g., using typical mask and implant steps. So, in this example, the surface polysilicon layer is P-type polysilicon forming the third junction and, preferably P+ doped polysilicon, e.g., doped with $BF_2$ at a density of 1.2E13 at 70 keV. Although not specifically shown here, FETs are formed in surface layer islands 128. Once source/drain and SCR contact diffusions 150, 152 are formed, self aligned suicide 154 is formed on the source/drain and SCR contact diffusions 150, 152.

Figure 2F:
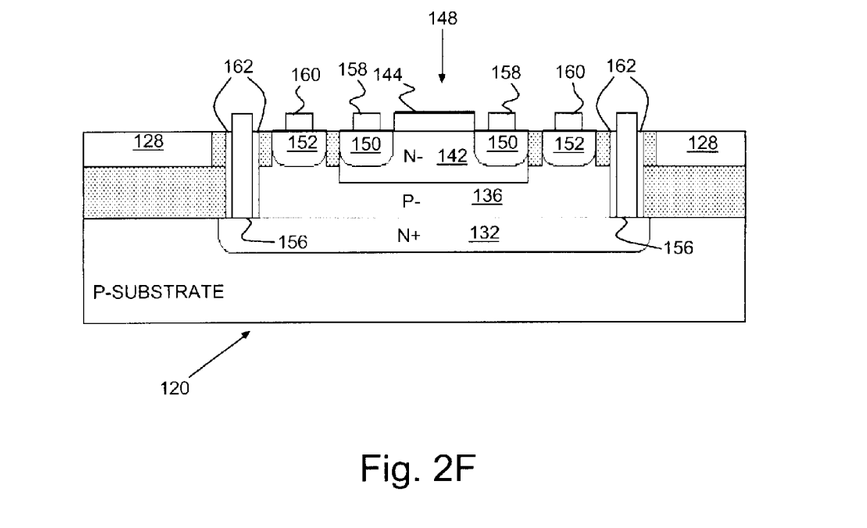

Having completed FET definition, SCRs 148 have also been defined with the PNPN in structure 144, 142, 136, 132. So in step 114 as shown in FIG. 2F, contacts 156 are formed to SCR buried sub-collectors 132 and contacts 158, 160 are formed to contact diffusions 150, 152, respectively. For each SCR 148, this buried sub-collector contact 156 may be a single ring around the SCR 148, a single contact or, a series of appropriately located contacts distributed around the SCR perimeter. Preferably, a hole is opened through STI areas, 138 in FIG. 2E, through underlying BOX layer to the buried sub-collector 132 and the hole is lined with an insulating liner 162, e.g., a silicon oxide. Then, the area within the insulating liner 162 is filled with conductive material, such as metal or N− polysilicon. The buried sub-collector contacts 156 are completed with the remaining contacts 158, 160, e.g., by depositing a conductive material (e.g., metal or N-polysilicon) layer onto a patterned (e.g., contact via) layer and patterning/planarizing the conductive material layer. Preferably, however, the contacts 158, 160 and the upper portion of buried sub-collector contacts 156 are formed as part of a wiring layer. After forming buried sub-collector contacts 156 and contacts 158, 160, devices are connected together into chip circuits and to off chip pads, using typical Integrated Circuit (IC) interconnection formation steps, e.g., forming silicide on polysilicon electrodes (including SCR electrodes) in step 116, forming typical electrode contacts and wiring metallization through typical BEOL processing in step 118.

It is understood that, although described in terms of an N-type buried sub-collector in a P-type substrate and P-type polysilicon top electrode, a preferred SCR may be identically formed with a P-type buried sub-collector in a N-type substrate and N-type polysilicon top electrode with selection of appropriate dopants and suitable dopant concentrations as are well known in the art. Further, it is understood that for simplicity of description of forming a preferred SCR, specific reference to typical intermediate semiconductor processing steps, such as an appropriate Rapid Thermal Anneal (RTA) has been omitted. Such typical semiconductor processing steps are understood to be included where normally appropriate and necessary.

Figure 3A:
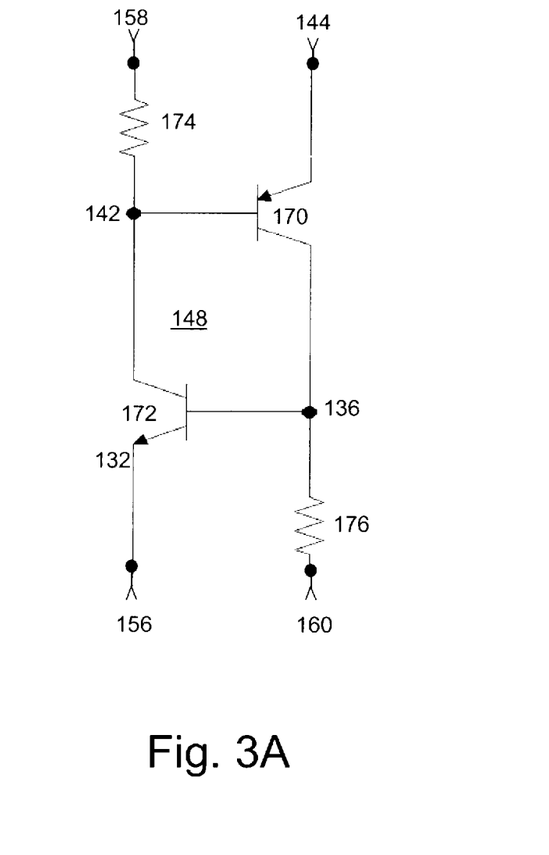
FIG. 3A shows a schematic example of the preferred vertical SCR.
Figure 3B:
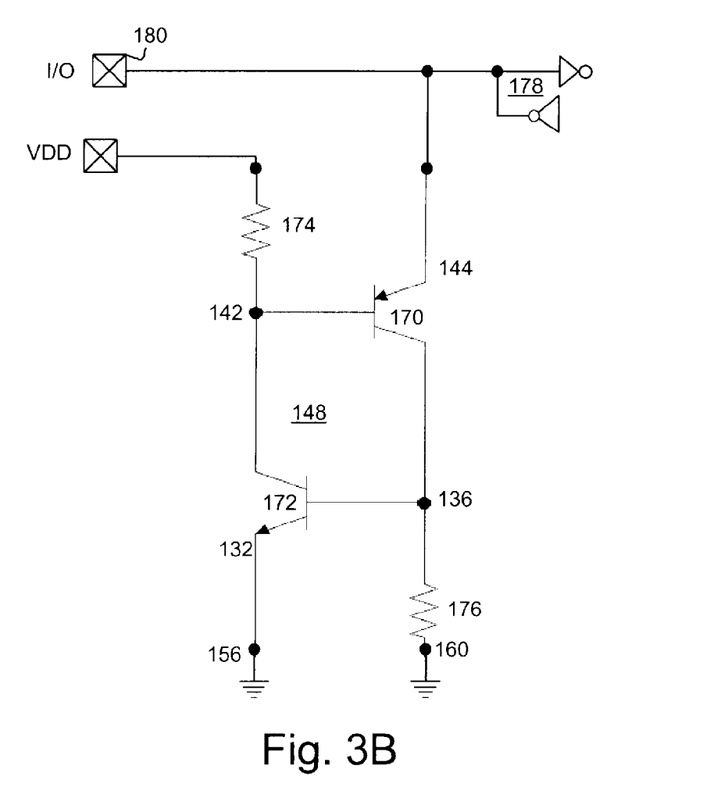
FIG. 3B shows a typical circuit application of the preferred vertical SCR.

FIG. 3A shows a schematic example of the SCR 148 of FIG. 2F with like features labeled identically and FIG. 3B shows typical circuit application with reference to the preferred SCR 148 of FIGS. 2E and F. In the example of FIGS. 3A and B, the SCR 148 (which also may be represented as a pair of series connected diodes) is represented as back to back transistors, i.e., PNP transistor 170 and NPN transistor 172. Resistors 174, 176 are intrinsic resistance of the diffusions (e.g., 150, 152). So, in the circuit example of FIG. 3B, the buried sub-collector contact 156 and P+ diffusion contact 160 are connected to ground. The protected circuit 178 is connected to an Input/Output (I/O) pad 180 at P-type polysilicon 144. The N+ diffusion contact 158 is connected to a supply, $V_{DD}$. Normally, with I/O voltage swings between $V_{DD}$ and ground, both transistors 170, 172 are off with both respective base to emitter junctions below turn-on.

However, if a large enough spike above $V_{DD}$ occurs at the I/O 180, e.g., $\sim V_{DD}+0.7$ volts, transistor 170 turns on and a voltage develops across resistor 176. When the voltage across resistor 176 exceeds the base to emitter turn-on voltage, e.g., ~0.7 volts, transistor 172 turns on and also begins to conduct, which develops a voltage across resistor 174. When the voltage across resistor 174 exceeds the base to emitter turn on voltage, both transistors 170, 172 are biased on, i.e., the SCR 148 is on and attempts to clamp the I/O pad 180 and, correspondingly, the input to the protected circuit 178 to ground. The SCR 148 turns of when the voltage at the I/O pad 180 falls sufficiently that the voltage across resistor 176 is below the base to emitter turn on voltage, which turns off transistor 172; transistor 172 turning off reduces the voltage across resistor 174, which turns off transistor 170 and the SCR 148.

Figure 4A:
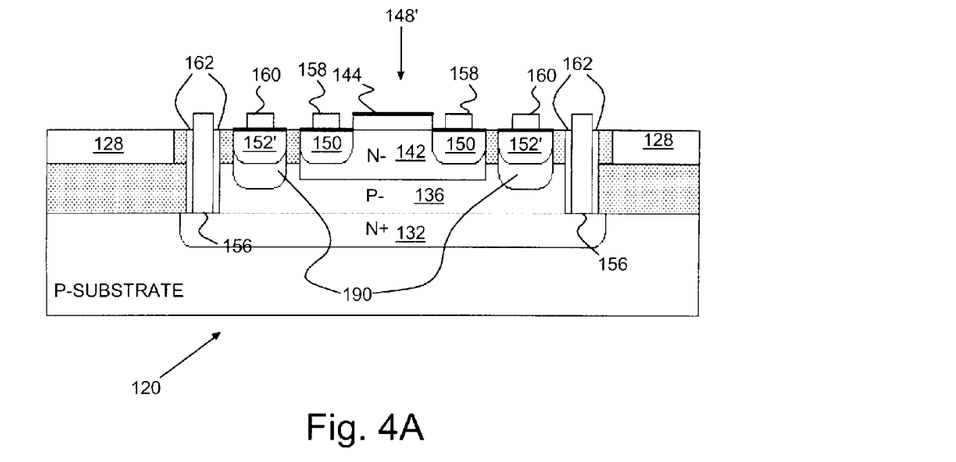
FIGS. 4A-B show variations on the preferred vertical SCR.
Figure 4B:
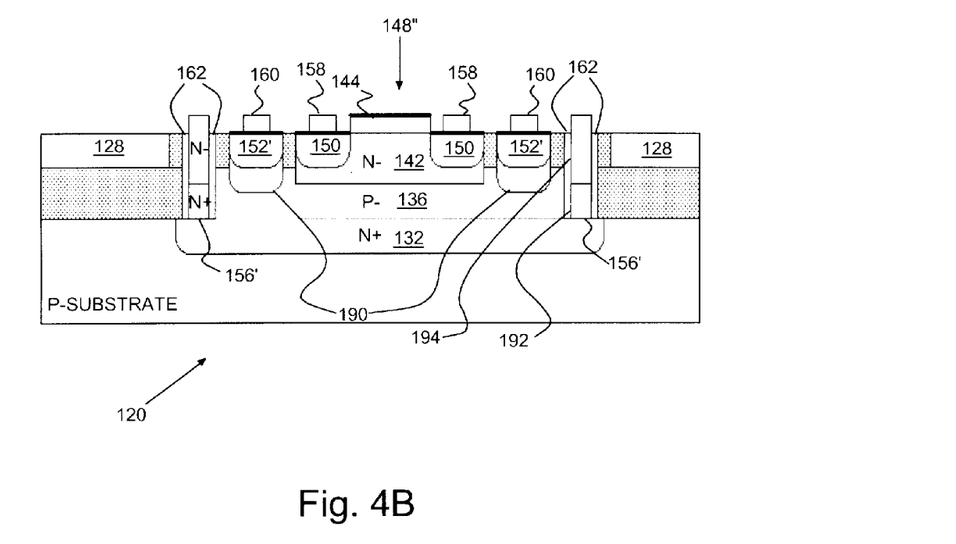

FIGS. 4A-B show SCR variations on the embodiment of FIGS. 2A-F, each SCR formed substantially identically with like elements labeled identically. In the example of FIG. 4A, the SCR 148' has P-wells 190 formed in the P– epi 136 prior to forming SCR contact diffusions 152', which decreases intrinsic base resistance and transistor gain. In the example of FIG. 4B, in addition to the P-wells 190, the buried sub-collector contact 156' is layered polysilicon with a lower N+ doped layer 192, preferably doped at a dopant level of $5-7*10^{19}$ and the balance 194 doped N-polysilicon, e.g., $10^{18}$.

Figure 5A:
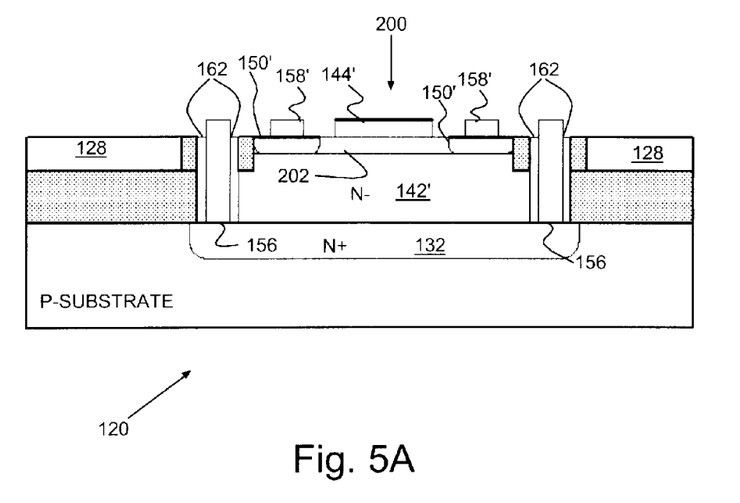
FIGS. 5A-B show vertical bipolar transistors formed according to a preferred embodiment of the present invention.
Figure 5B:
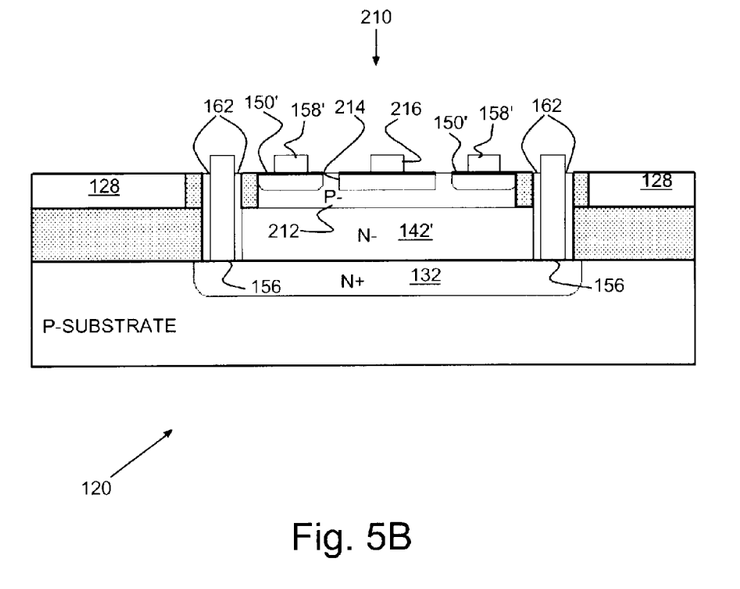

FIGS. 5A-B show examples of bipolar transistors 200, 210 formed substantially identically to forming SCRs as shown in FIGS. 2A-F with like features labeled identically. In the example of FIG. 5A, instead of forming P– epi, an N– epi 142' is formed on the buried sub-collector 132. A thin (e.g., 40 nm) P– base layer 202 is formed in the N– epi surface and N+ doped polysilicon emitter 144' is formed on the thin P– base layer 202. Extrinsic base diffusions 150' and contacts 158' are formed substantially as described for and, preferably, with SCR P+ epi diffusions 152 and contacts 160 in FIGS. 2E and F. Similarly, in the example of FIG. 5B, instead of forming P– epi, an N– epi 142' is formed on the buried sub-collector 132. However, in this example a thicker (e.g., 90 nm) P– base layer 212 is formed in the N– epi surface and N+ doped diffusion emitter 214 is formed on the thin P– layer 212 with extrinsic base diffusions 150'. Similarly, emitter contacts 214 are formed with base contacts 158', substantially as described for and, preferably, with SCR N+ diffusions 150, P+ epi diffusions 152 and contacts 158, 160 in FIGS. 2E and F.

Figure 6A:
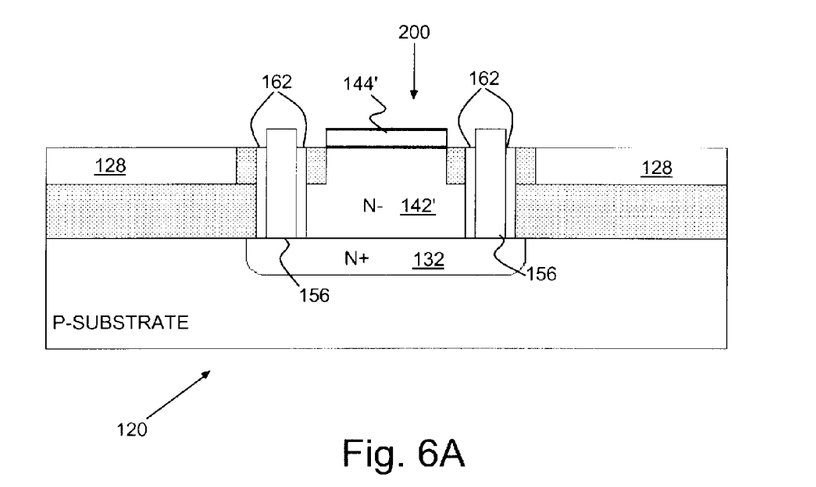
FIG. 6 shows a cross-section of a vertical decoupling capacitor formed according to a preferred embodiment of the present invention.
Figure 6B:
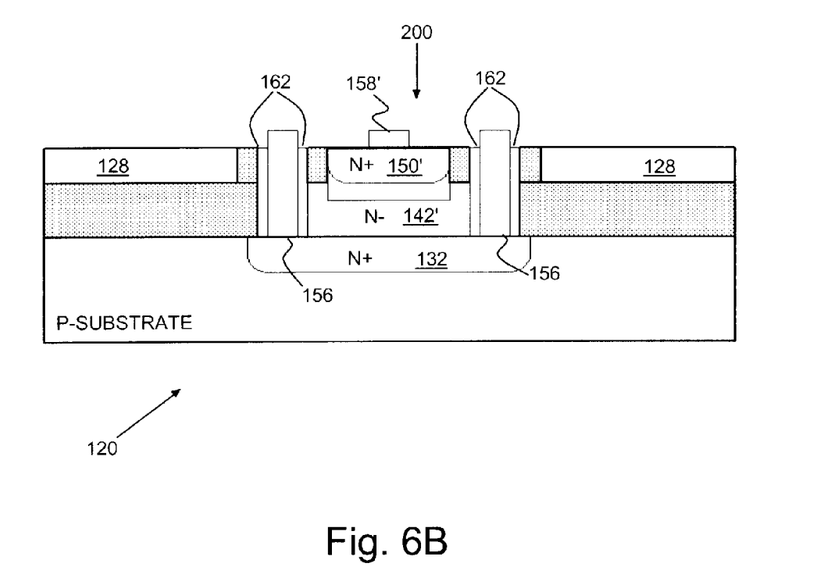

FIG. 6A-B show examples respectively of a vertical decoupling capacitor 220 and a vertical resistor 230 formed substantially identically to the bipolar transistor 200 of FIG. 5A with like features labeled identically. In this example, after forming N– epi 142', instead of stripping the gate oxide, the gate oxide or a dielectric layer 222 is formed and an N+ polysilicon plate 224 is formed on the dielectric 222. Optionally, for higher capacitance the dielectric layer 222 may be formed of a high K dielectric, for example. For the vertical resistor 230 example of FIG. 6B, during normal PFET body definition, the epi is doped with N-type dopant to a normal PFET body dopant level. Then, during NFET source/drain implant, the surface is implanted and diffused to form N+ diffusion 150' with SCR N+ diffusions 150 and a contact 160' is formed on the N+ diffusion 150' with contacts 160 in FIGS. 2E and F.

Figure 7:
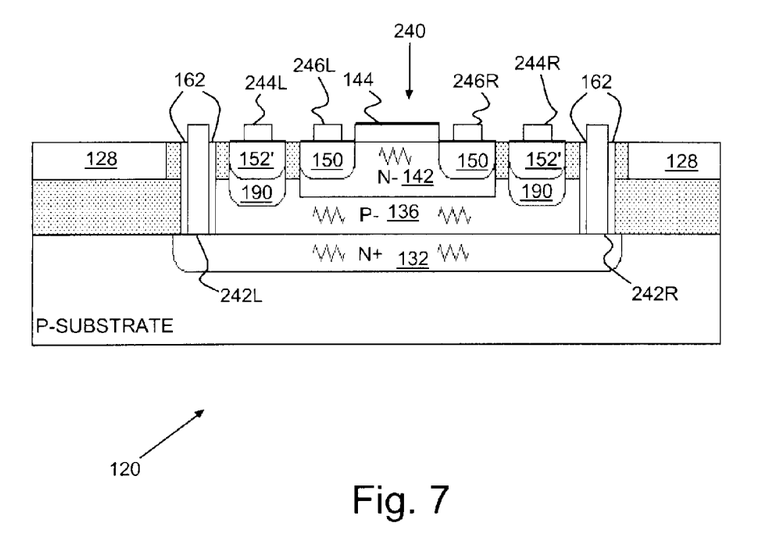
FIG. 7 shows an example of a horizontal resistor formed substantially identically to forming a preferred vertical SCR.

FIG. 7 shows an example of a horizontal resistor 240 formed substantially identically to forming the SCR 148' of FIG. 4A with like features labeled identically. Primarily the difference between the SCR 148' embodiment, and the resistor 240 of this example is that instead of a common contact to diffusions 132, 150, 152' at each layer 132, 136 and 142, contact terminals 242L, 244L, 246L are separate from contact terminals 242R, 244R, 246R with a resistor formed on each layer 132, 136, 142. Typically, the resulting resistance in the buried layer 132, P– epi layer 136 and N– surface layer 142 is based on normal process dependent dopant levels for those corresponding levels and may be selectively varied for the specific application with appropriate dopant variation. Device resistance may be tailored by selectively paralleling resistive layers, i.e., by connecting together pairs of contact terminals 242L/242R, 244L/244R and 246L/246R. Unused layers are normally tied to reverse bias the respective layer 132, 136, 142, i.e., $V_{DD}$, ground and $V_{DD}$, respectively.

Figure 8:
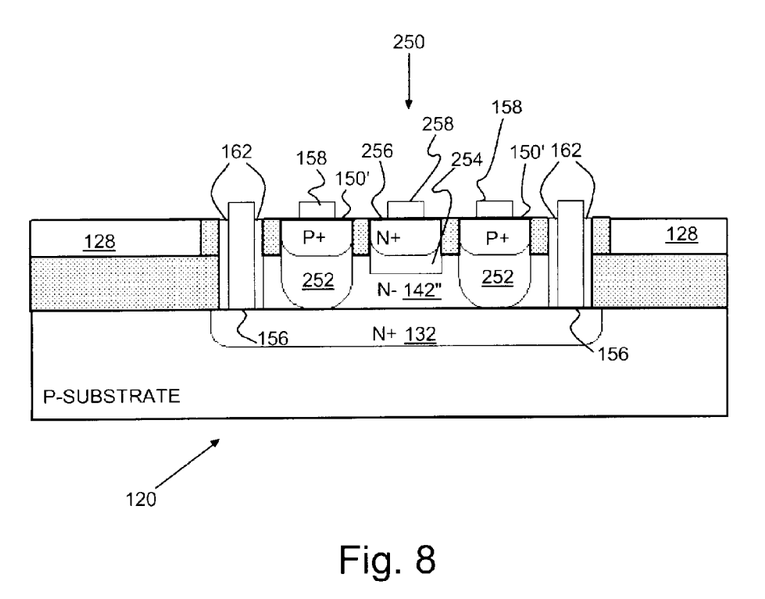
FIG. 8 shows an example of a vertical pinch resistor formed substantially identically to forming a preferred vertical SCR.

FIG. 8 shows an example of a vertical pinch resistor 250 formed substantially identically to forming SCR 148' of FIG. 4A with like features labeled identically. In this embodiment, an N– epi 142" is grown on the buried diffusion 132. P-wells 252 are formed at either end of the N– epi 142" and an NFET body doped region 254 is formed between the P-wells 252, e.g., by doping the N– epi 142" with NFET body tailoring dopant. P+ diffusions 150' are formed in the P-wells 252 and an N+ diffusion 256 is formed in the NFET body doped region 254, e.g., during typical source/drain diffusion formation steps. A contact 258 is formed to the N+ diffusion 256 coincident with forming contacts 158. Resistance between the buried layer contacts 162 and contact 258 can be modulated by applying a positive (to either or both resistor terminals 162, 258) voltage to P diffusion contacts 158.

Advantageously, SCRs formed according to the present invention are high performance vertical SCRs formed in standard SOI for protecting SOI CMOS circuits. Since rather than formed in a single SOI surface layer, the preferred SCRs are vertical, they occupy relatively little chip real estate and can provide levels of ESD protection not previously available with SOI CMOS. Similarly, vertical bipolar transistors, vertical capacitors and resistors and horizontal resistors as well occupy significantly less chip real estate than previously available with SOI CMOS.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

We claim:

1. A method comprising:
   providing a semiconductor substrate including an insulating layer formed on the substrate and an active layer formed over said insulating layer;
   forming an opening through said active layer and said insulating layer to said substrate, said opening exposing a portion of said substrate;
   forming a doped region in said exposed portion of said substrate;
   filling said opening with a semiconductor layer; and
   defining device regions in said semiconductor layer.

2. The method of claim 1, wherein said step of filling said opening comprises growing an epitaxial layer on said doped region.

3. The method of claim 2, wherein said epitaxial layer is doped with a second dopant type and the step of defining device regions comprises the steps of:
   forming a first dopant type layer in an upper surface of said epitaxial layer; and
   forming a second dopant type layer on said upper surface.

4. The method of claim 3, wherein before the step of forming said first dopant type layer in said upper surface, said method further comprises forming shallow trenches through said active layer and in said upper surface, said first dopant type layer being formed in a portion of said upper surface separated from the remainder of said upper surface by ones of shallow trenches.

5. The method of claim 4, wherein the step of defining device regions further comprises the steps of:
   forming diffusion regions in said upper surface, first dopant type diffusion regions forming adjacent said second dopant type layer and second dopant type diffusion regions forming in said remainder; and
   forming contacts to said diffusion regions and said doped region.

6. The method of claim 5, wherein said doped region extends beyond said opening, outboard said shallow trenches formed through said active layer removing portions of said active layer above said doped region, contact liners being formed through said outboard shallow trenches and extending to said doped region, said contacts to said doped region being formed in said contact liners.

7. The method of claim 6, wherein said substrate is a silicon substrate and said active layer is a silicon surface layer in a Silicon-On-Insulator chip, said first dopant type is P-type, said second dopant type is N-type and said P-type layer on said upper surface is a polysilicon layer.

8. The method of claim 7, wherein before forming said diffusions, said method comprises forming P-wells in said epitaxial layer at said remainder, p-type diffusions at said remainder being formed in said P-wells.

9. The method of claim 8, wherein said contacts to said doped region are layer-doped polysilicon.

10. The method of claim 7, wherein a vertical silicon controlled rectifier (SCR) is formed in said epitaxial layer and said doped region.

11. The method of claim 7, wherein a horizontal resistor is formed in said opening, with contacts to said epitaxial layer and said doped region on either side of said opening being contacts at either end of said horizontal resistor.

12. The method of claim 2, wherein said epitaxial layer is doped with the first type dopant and forming device regions comprises:
   forming a dielectric layer on said doped epitaxial layer; and
   forming a conductive layer on said dielectric layer, said doped epitaxial layer and said conductive layer being plates of a vertical capacitor.

13. The method of claim 2, wherein said epitaxial layer is doped with a plurality of layers of a first dopant type, said doped epitaxial layer and said conductive layer forming a vertical resistor.

14. The method of claim 13, before doping said plurality of layers in said epitaxial layer, said method further comprising:
   forming shallow trenches in said active surface layer and said epitaxial layer, a central portion of said epitaxial layer being doped with said plurality of layers of first type dopant; and
   doping outboard portions of said epitaxial layer with a plurality of layers of a second dopant type, said vertical resistor being a vertical pinch resistor.

15. The method of claim 14, wherein said first type dopant is N-type and said second dopant type is P-type, forming said N-type layers in said central portion comprising doping a body layer in said central portion and forming an n-type diffusion in said a body layer; and doping plurality of P-type layers comprises implanting a P-well in said outboard portions and forming a P-type diffusion in each said P-well.

16. The method of claim 2, wherein a bipolar transistor is formed in said epitaxial layer, said epitaxial layer is doped said first type dopant and the step of defining device regions comprises the steps of:
   forming a second dopant type base layer in an upper surface of said epitaxial layer; and
   forming a first dopant type emitter layer at said upper surface.

17. The method of claim 1, wherein said step of forming a doped region comprises ion implanting said region with a first dopant type impurity.

18. The method of claim 17, wherein said substrate is doped with a second dopant type impurity, said second dopant type being opposite said first dopant type.

19. The method of claim 18, wherein said first dopant type is N-type and said second type is P-type.

20. A method of forming Integrated Circuit chips, said method comprising the steps of:
   a) providing a Silicon On Insulator (SOI) wafer;
   b) opening seed holes through a surface layer of said SOI wafer to a semiconductor substrate;
   c) forming a buried diffusion in said semiconductor substrate in each of said seed holes;
   d) forming an epitaxial layer on said diffusion, said epitaxial layer filling a respective seed hole; and
   e) forming contacts to each of said buried diffusion and said epitaxial layer, said contacts contacting opposite ends of a circuit element formed by said buried diffusion and said epitaxial layer.

21. A method as in claim 20, wherein the step (b) of opening seed holes comprises:
   i) patterning said surface layer;
   ii) selectively removing portions of the patterned said surface layer; and
   iii) removing insulator exposed by removing said portions, exposed said insulator being removed to said semiconductor substrate.

22. A method as in claim 21, wherein said semiconductor substrate is P-type silicon and the step (c) of forming said buried diffusion in said substrate comprises implanting an exposed surface of said silicon substrate with N-type dopant in an angled implant.

23. A method as in claim 22, wherein the step (d) of forming said epitaxial layer comprises growing intrinsically doped P-type silicon on said buried diffusion.

24. A method as in claim 23, wherein the step (d) of forming said epitaxial layer further comprises forming shallow trenches through said active layer and in an upper surface of said epitaxial layer, a portion of said upper surface being separated from the remainder of said upper surface by shallow trenches.

25. A method as in claim 24, wherein the step (d) of forming said epitaxial layer further comprises the steps of:
   i) forming an N-type layer in said portion; and
   ii) forming a P-type layer on said N-type layer.

26. A method as in claim 25, wherein said P-type layer formed in step (d)(1) is a polysilicon layer and the step (e) of forming contacts comprises the steps of:
   i) forming N-type diffusions adjacent said polysilicon layer and P-type diffusions in the surface of said remainder; and
   ii) forming a contact to each diffusion.

27. A method as in claim 26, wherein forming contacts to said buried diffusion comprises forming contact liners through outboard shallow trenches to said buried diffusion, and forming said contacts to said buried diffusion in said contact liners.

28. A method as in claim 27, wherein metal contacts are formed in said contact liners to said buried diffusion.

29. A method as in claim 27, wherein doped polysilicon contacts are formed in said contact liners to said buried diffusion.

30. A method as in claim 27, wherein before step (e)(i), said method further comprises forming P-wells in said epitaxial layer at said remainder, said P-type diffusions being formed in said P-wells.

31. A method as in claim 30, wherein forming said contacts to said buried diffusion comprises:
   forming a first layer of doped polysilicon in said contact liners, said first layer being doped to a first dopant concentration; and
   forming a second layer of doped polysilicon on said first layer, said second layer being doped to a second dopant concentration lower than said first concentration.

32. A method as in claim 27, wherein at least one said circuit element is a vertical silicon controlled rectifier (SCR).

33. A method as in claim 27, wherein at least one said circuit element is a horizontal resistor, contacts to said diffusions and said buried diffusion being formed on either side of said opening and being contacts at either end of said horizontal resistor.

34. A method as in claim 22, wherein said buried diffusion and said epitaxial layer are doped with N-type dopant, said circuit element is a vertical capacitor and, before the step (e) of forming contacts, said method comprises:
   e1) forming a dielectric layer on said doped epitaxial layer; and
   e2) forming a conductive layer on said dielectric layer.

35. A method as in claim 22, wherein at least one said circuit element is a vertical resistor formed by forming a plurality of N-type layers in said epitaxial layer.

36. A method as in claim 35, wherein said vertical resistor is a vertical pinch resistor and the step (e) of forming contacts comprises:
   i) forming shallow trenches in said active surface layer and said epitaxial layer;
   ii) forming P-wells in said epitaxial layer outboard of ones of said shallow trenches; and
   iii) forming P-type diffusions in said P-wells.

37. A method as in claim 20, wherein a bipolar transistor is formed in said epitaxial layer, the step (d) of forming said epitaxial layer comprises intrinsically growing a doped epitaxial layer, doped with the same dopant type as said buried diffusion and opposite dopant type said semiconductor substrate, the step (d) of intrinsically growing said epitaxial layer further comprising the steps of:
   i) forming a base layer in an upper surface of said epitaxial layer; and
   ii) forming an emitter layer at said upper surface.

38. The method of claim 37, wherein said buried diffusion is N-type, said semiconductor substrate is P-type silicon and said emitter layer is N-type polysilicon formed on said upper surface.

39. The method of claim 37, wherein said buried diffusion is N-type and said semiconductor substrate is P-type silicon and said N-type emitter layer is formed in said base layer at said upper surface.

* * * * *